(12) United States Patent
Obata et al.

(10) Patent No.: US 11,647,583 B2
(45) Date of Patent: May 9, 2023

(54) PREPREG, METAL-CLAD LAMINATED BOARD, AND PRINTED WIRING BOARD

(71) Applicant: Panasonic Intellectual Property Management Co., Ltd., Osaka (JP)

(72) Inventors: Shimpei Obata, Fukushima (JP); Ryuuji Takahashi, Fukushima (JP); Yasunori Hoshino, Osaka (JP); Shigetoshi Fujita, Fukushima (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 339 days.

(21) Appl. No.: 16/095,120

(22) PCT Filed: Apr. 18, 2017

(86) PCT No.: PCT/JP2017/015528
§ 371 (c)(1),
(2) Date: Oct. 19, 2018

(87) PCT Pub. No.: WO2017/183621
PCT Pub. Date: Oct. 26, 2017

(65) Prior Publication Data
US 2019/0150279 A1 May 16, 2019

(30) Foreign Application Priority Data
Apr. 19, 2016 (JP) .............................. JP2016-084034

(51) Int. Cl.
*H05K 1/03* (2006.01)
*B32B 15/08* (2006.01)
*B32B 5/28* (2006.01)
*C08J 5/10* (2006.01)
*C08J 5/24* (2006.01)
*H01L 23/498* (2006.01)
*H05K 1/02* (2006.01)

(52) U.S. Cl.
CPC ............ *H05K 1/0373* (2013.01); *B32B 5/28* (2013.01); *B32B 15/08* (2013.01); *C08J 5/10* (2013.01); *C08J 5/244* (2021.05); *H01L 23/49894* (2013.01); *H05K 1/0271* (2013.01); *H05K 1/03* (2013.01); *H05K 1/0366* (2013.01); *B32B 2262/101* (2013.01); *B32B 2457/08* (2013.01); *C08J 2361/06* (2013.01); *C08J 2361/08* (2013.01); *C08J 2363/00* (2013.01); *C08J 2379/08* (2013.01); *C08J 2425/12* (2013.01); *C08J 2433/00* (2013.01); *C08J 2433/04* (2013.01); *C08J 2433/12* (2013.01); *C08J 2433/20* (2013.01); *C08J 2461/06* (2013.01); *C08J 2461/08* (2013.01); *C08J 2463/00* (2013.01); *C08J 2475/00* (2013.01); *C08J 2479/08* (2013.01); *C08J 2483/04* (2013.01); *H05K 2201/0218* (2013.01); *H05K 2201/0227* (2013.01)

(58) Field of Classification Search
CPC .. H05K 1/0271; H05K 1/0373; H05K 1/0366; C08J 5/24; B32B 2305/076; B32B 2457/08
See application file for complete search history.

(56) References Cited

U.S. PATENT DOCUMENTS

| 8,029,889 | B1* | 10/2011 | Li ........................... | C08L 63/00 428/292.1 |
| 2009/0017316 | A1* | 1/2009 | Kato ........................ | C08L 79/04 428/447 |
| 2009/0266591 | A1* | 10/2009 | Amou ........................ | C08J 5/24 174/258 |
| 2010/0096173 | A1 | 4/2010 | Fujino et al. | |
| 2010/0143728 | A1* | 6/2010 | Tsuchikawa ........... | C08G 73/12 428/457 |
| 2010/0230382 | A1* | 9/2010 | Narahashi .............. | H05K 3/381 156/247 |

(Continued)

FOREIGN PATENT DOCUMENTS

| CN | 103906797 A | 7/2014 |
| JP | 2008-238603 A | 10/2008 |

(Continued)

OTHER PUBLICATIONS

Segal—core-shell styrene-acrylate—J.Appl.Poly.Sci.—vol. 58, pp. 385-399—1995 (Year: 1995).*
Hayes—Modification of thermosetting resins w—preformed polymer particles—Poly.Comp.—2001 (Year: 2001).*
Nguyen—core-shell particles in fiber-epoxy composites—Internl. Conf.Comp.Mat.+cite—2011 (Year: 2011).*
PubChem—Acrylonitrile_H2CCHCN—Jun. 17, 2022 (Year: 2022).*
International Search Report issued in Application No. PCT/JP2017/015528 dated Jul. 18, 2017, with English translation.

*Primary Examiner* — John Vincent Lawler
(74) *Attorney, Agent, or Firm* — McDermott Will & Emery LLP

(57) ABSTRACT

A prepreg contains a base material containing a reinforcing fiber and a semi-cured product of a resin composition impregnated into the base material containing a reinforcing fiber. The prepreg after cured has a glass transition temperature (Tg) which is higher than or equal to 150° C. and lower than or equal to 220° C. The resin composition contains (A) a thermosetting resin and (B) at least one compound selected from a group consisting of core shell rubber and a polymer component having a weight average molecular weight of 100000 or more. An amount of the (B) component is higher than or equal to 30 parts by mass and lower than or equal to 100 parts by mass with respect to 100 parts by mass of the (A) component.

9 Claims, No Drawings

(56) References Cited

U.S. PATENT DOCUMENTS

| | | | |
|---|---|---|---|
| 2011/0097212 A1* | 4/2011 | Thompson | C08L 63/00 977/788 |
| 2012/0288659 A1* | 11/2012 | Hoshi | C09J 7/10 428/41.8 |
| 2014/0079924 A1* | 3/2014 | Moon | H05K 1/0373 428/209 |
| 2014/0367150 A1 | 12/2014 | Inoue et al. | |
| 2015/0210906 A1 | 7/2015 | Liang et al. | |
| 2015/0259489 A1 | 9/2015 | Umehara et al. | |
| 2016/0002460 A1* | 1/2016 | Nomura | C08F 293/005 524/558 |

FOREIGN PATENT DOCUMENTS

| | | |
|---|---|---|
| JP | 2009-074036 A | 4/2009 |
| JP | 2011-068788 A | 4/2011 |
| JP | 2014-070156 A | 4/2014 |
| JP | 2015-63040 A | 4/2015 |
| JP | 2015-172144 A | 10/2015 |
| JP | 2016-501922 A | 1/2016 |

* cited by examiner

PREPREG, METAL-CLAD LAMINATED BOARD, AND PRINTED WIRING BOARD

RELATED APPLICATIONS

This application is the U.S. National Phase under 35 U.S.C. § 371 of International Application No. PCT/JP2017/015528, filed on Apr. 18, 2017, which claims the benefit of Japanese Application No. 2016-084034, filed on Apr. 19, 2016, the disclosures of which Applications are incorporated by reference herein.

TECHNICAL FIELD

The present invention relates to prepregs, meta-clad laminated boards, and printed wiring boards.

BACKGROUND ART

Printed wiring boards are widely used in various areas of technology such as electronic devices, communication devices, and calculators. In recent years, especially small mobile devices such as mobile communication devices and laptop computers have been rapidly becoming more and more diverse, high performance, thin, and small. Accordingly, printed wiring boards using in such devices are required to have smaller conductor wiring, have multilayered conductive wiring layers, be thinner, and be capable of higher performance with high machine properties. Especially, since printed wiring boards are becoming thinner and thinner, there arises a problem that warpage occurs in a semiconductor package including a semiconductor chip mounted on a printed wiring board. Such semiconductor package with warpage may not be properly incorporated in electronic devices.

In order to prevent warpage of a semiconductor package including a semiconductor chip mounted on a printed wiring board, Patent Literature 1 discloses a metal-clad laminated board including metal foils on both surfaces of a insulating layer which includes an epoxy resin composition and a fiber base material, wherein the epoxy resin composition contains an epoxy resin, a bismaleimide compound, and an inorganic filler, and hysteresis of size change of the metal-clad laminated board in a temperature range of 30 to 260° C. lies within a certain range. It is disclosed that an average linear expansion coefficient calculated in a plane direction (XY direction) of the insulating layer in the range of 30 to 260° C. is small and warpage of a semiconductor device in which a semiconductor element is mounted on a printed wiring board at a room temperature (23° C.) and at 260° C. can be reduced, even if large change in temperature such as the temperature exceeding the glass transition temperature of the insulating layer occurs, since the epoxy resin composition contains the bismaleimide compound and the hysteresis lies within a certain range.

However, there exists a problem that the metal-clad laminated board disclosed in Patent Literature 1 cannot sufficiently prevent warpage of the semiconductor package.

In addition, drilling and laser processing are performed on a printed wiring board to create holes for connecting conductor patterns formed on multiple layers. Resin smear tends to be generated on inner walls of the holes when the holes are created. Due to this, a desmear process is necessary to remove the resin smear. The desmear process is performed by using, for example, permanganate such as potassium permanganate.

However, when an amount of the resin smear removed by the desmear process (an amount of desmear etching) is large, deformation of the holes and pealing of the copper foil might occur, leading to decrease in conduction reliability of the printed wiring board. Therefore, it is desired to reduce the amount of desmear etching, i.e., to improve desmear resistance.

CITATION LIST

Patent Literature

Patent Literature 1: JP 2015-63040 A

SUMMARY OF INVENTION

The present invention aims to provide a prepreg, a metal-clad laminated board, and a printed wiring board in which warpage of a semiconductor package due to temperature change can be reduced and desmear resistance is excellent even when a printed wiring board is thin.

A prepreg according to one embodiment of the present invention includes: a base material containing a reinforcing fiber; and a semi-cured product of a resin composition impregnated into the base material containing a reinforcing fiber, wherein the prepreg after cured has a glass transition temperature (Tg) which is higher than or equal to 150° C. and lower than or equal to 220° C., the resin composition contains: (A) a thermosetting resin; and (B) at least one compound selected from a group consisting of core shell rubber and a polymer component having a weight average molecular weight of 100000 or more, and an amount of the (B) component is higher than or equal to 30 parts by mass and lower than or equal to 100 parts by mass with respect to 100 parts by mass of the (A) component.

A metal-clad laminated board according to one embodiment of the present invention contains: a cured product of a sheet of the prepreg or a stack of two or more sheets of the prepreg; and a metal foil bonded to one or both surfaces of the cured product.

A printed wiring board according to one embodiment of the present invention contains: a cured product of a sheet of the prepreg or a stack of two or more sheets of the prepreg; and a conductor wiring provided on one or both surfaces of the cured product.

DESCRIPTION OF EMBODIMENTS

Hereinafter, one embodiment of the present invention is explained.

[Prepreg]

A prepreg according to the present embodiment (hereinafter, also referred to as prepreg) contains a base material containing a reinforcing fiber; and a semi-cured product of a resin composition impregnated into the base material containing a reinforcing fiber, wherein the prepreg after cured has a glass transition temperature (Tg) which is higher than or equal to 150° C. and lower than or equal to 220° C. The resin composition contains: (A) a thermosetting resin; and (B) at least one compound (hereinafter also referred to as rubber component (B)) selected from a group consisting of core shell rubber (hereinafter also referred to as core shell rubber (B1)) and a polymer component having a weight average molecular weight of 100000 or more (hereinafter also referred to as polymer component (B2)). An amount of the rubber component (B) (the (B) component) is higher than or equal to 30 parts by mass and lower than or equal to 100 parts by mass with respect to 100 parts by mass of the (A) component. When the prepreg of the present embodiment is used as a material for a semiconductor package including a semiconductor chip mounted on a printed wiring board, stress in the semiconductor chip and the printed wiring board can be effectively reduced and warpage of the semiconductor package due to temperature change can be reduced, without adjusting the resin composition so that elastic modulus at 260° C. of the cured product of the prepreg becomes high and a thermal expansion coefficient of a cured product of the prepreg lies within a certain range. Further, when the prepreg of the present embodiment is used for a printed wiring board, an amount of desmear etching of resin smear generated while creating holes for connecting layers becomes less, and thus conduction reliability of the printed writing board is less likely to decrease.

A glass transition temperature (Tg) of the cured product of the prepreg is higher than or equal to 150° C. and lower than or equal to 220° C., preferably higher than or equal to 160° C. and lower than or equal to 200° C., more preferably higher than or equal to 180° C. and lower than or equal to 200° C. When the glass transition temperature (Tg) of the cured product of the prepreg is higher than 220° C., warpage of the semiconductor package due to temperature change might increase. Also, when the glass transition temperature (Tg) of the cured product of the prepreg is lower than 150° C., desmear resistance might not be sufficient.

The elastic modulus of the cured product of the prepreg at 260° C. is preferably higher than or equal to 0.5 GPa and lower than or equal to 7.0 GPa, and more preferably higher than or equal to 0.5 GPa and lower than or equal to 5.0 GPa. When the elastic modulus of the cured product of the prepreg at 260° C. is within the above range, warpage of the semiconductor package due to temperature change can be more reduced.

A thickness of the prepreg can be appropriately selected depending on properties desired by use of a both-side metal-clad laminated board, and is preferably within a range of 0.010 to 0.200 mm. A resin content of the prepreg (an amount of the resin composition) is preferably within a range of 30 to 80 parts by mass with respect to 100 parts by mass of the prepreg.

[Semi-Cured Product of Resin Composition]

A semi-cured product of the resin composition is formed by semi-curing the resin composition.

The resin composition contains the thermosetting resin (A) and the rubber component (B), and if necessary further contains an inorganic filler (C), a curing agent, a curing accelerator, and an additive.

{Thermosetting Resin (A)}

The resin composition contains the thermosetting resin (A). For example, an epoxy resin, a phenol resin, a bismaleimide resin, and a cyanate resin may be used as the thermosetting resin (A). One kind of the above listed compound may be used alone and two or more kinds of the above listed compounds may be used in combination as the thermosetting resin (A). The thermosetting resin (A) preferably contains at least one kind of compound (hereinafter referred to as thermosetting resin (A1)) selected from a group consisting of an epoxy resin, a phenol resin, a bismaleimide resin, and a cyanate resin.

(Epoxy Resin)

Examples of the epoxy resin may include a bisphenol epoxy resin, a novolak epoxy resin, a biphenyl epoxy resin, a xylylene epoxy resin, an aryl alkylene epoxy resin, a naphthalene epoxy resin, a naphthalene-skeleton-modified epoxy resin, a triphenyl methane epoxy resin, an anthracene epoxy resin, a dicyclopentadiene epoxy resin, a norbornene epoxy resin, a fluorene epoxy resin, and a flame retardant epoxy resin obtained by halogenating precedingly listed epoxy resins. One kind of the above listed compound may be used alone and two or more kinds of the above listed compounds may be used in combination. Examples of the bisphenol epoxy resin may include a bisphenol A epoxy resin, a bisphenol F epoxy resin, a bisphenol S epoxy resin. Examples of the novolak epoxy resin may include a phenol novolak epoxy resin and a cresol novolak epoxy resin. Examples of the aryl alkylene epoxy resin may include a phenol aralkyl epoxy resin, a biphenyl aralkyl epoxy resin, a biphenyl novolak epoxy resin, a biphenyl dimethylene epoxy resin, a trisphenol methane novolak epoxy resin, and a tetramethyl biphenyl epoxy resin. Examples of the naphthalene-skeleton-modified epoxy resin may include a naphthalene-skeleton-modified cresol novolak epoxy resin, a naphthalene diol aralkyl epoxy resin, a naphthol aralkyl epoxy resin, a methoxy naphthalene-modified cresol novolak epoxy resin, and a methoxy naphthalene dimethylene epoxy resin.

An epoxy equivalent weight of the epoxy resin is preferably larger than or equal to 180 g/eq and more preferably larger than or equal to 200 g/eq. When the epoxy equivalent weight is larger than or equal to 180 g/eq, a crosslinking density of the cured product of the resin composition is less likely to be high and the glass transition temperature of the cured product of the prepreg is less likely to exceed 220° C. Note that the epoxy equivalent weight is the average molecular weight divided by the number of epoxy groups in one molecule. A hydroxyl equivalent weight is the average molecular weight divided by the number of hydroxyl groups in one molecule.

(Phenol Resin)

Examples of the phenol resin may include a biphenyl aralkyl phenol resin, a phenyl aralkyl phenol resin, a novolak phenol resin, a cresol novolak phenol resin, a bisphenol A novolak phenol resin, a naphthalene phenol resin, a tetrakisphenol phenol resin, and a phosphorus-modified phenol resin. One kind of the above listed compound may be used alone and two or more kinds of the above listed compounds may be used in combination.

A hydroxyl equivalent weight of the phenol resin is preferably larger than or equal to 140 g/eq and more preferably larger than or equal to 200 g/eq. When the hydroxyl equivalent weight is larger than or equal to 140 g/eq, the crosslinking density of the cured product of the resin composition is less likely to be high and the glass transition temperature of the cured product of the prepreg is less likely to be high.

(Bismaleimide Resin)

Examples of the bismaleimide resin may include 4,4'-diphenylmethane bismaleimide, phenyl methane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, and 1,6'-bismaleimide-(2,2,4-trimethyl)hexane. One kind of the above listed compound may be used alone and two or more kinds of the above listed compounds may be used in combination.

(Cyanate Resin)

A compound having two or more cyanate groups per molecule is preferable as the cyanate resin, and examples of the cyanate resin may include 2,2-bis(4-cyanate phenyl) propane(bisphenol A cyanate resin), bis(3,5-dimethyl-4-cyanate phenyl)methane, 2,2-bis(4-cyanate phenyl)ethane, and aromatic cyanate ester compounds such as derivatives of the precedingly listed compounds. One kind of the above listed compound may be used alone and two or more kinds of the above listed compounds may be used in combination.

{Rubber Component (B)}

The resin composition contains at least one compound (B) selected from a group consisting of the core shell rubber (B1) and the polymer component (B2) having a weight average molecular weight of 100000 or more. In other words, depending on the other components such as the thermosetting resin (A), the resin composition may contain, as the rubber component (B): the core shell rubber (B1) and the polymer component (B2) in combination; the core shell rubber (B1) alone; or the polymer component (B2) alone. Considering a balance between a warping property and processability (such as, for example, laser processability), the resin composition preferably contains both of the core shell rubber (B1) and the polymer component (B2).

An amount of the rubber component (B) is higher than or equal to 30 parts by mass and lower than or equal to 100 parts by mass with respect to 100 parts by mass of the (A) component. When the amount of the rubber component (B) is higher than 100 parts by mass, as explained later, there is a possibility of an increase in viscosity of a base resin in varnish form used to form the prepreg, which might result in poor formation of the prepreg. When the amount of the rubber component (B) is lower than 30 parts by mass, warpage of the semiconductor package due to temperature change might increase.

When the rubber component (B) contains the core shell rubber (B1) and an acryl resin (B2a) which is explained later, a total amount of the core shell rubber (B1) and the acryl resin (B2a) is preferably higher than or equal to 50 parts by mass and lower than or equal to 100 parts by mass, and more preferably higher than or equal to 60 parts by mass and lower than or equal to 80 parts by mass, with respect to 100 parts by mass of the (A) component. When the total amount of the core shell rubber (B1) and the acryl resin (B2a) is within the above range, warpage of the semiconductor package due to temperature change can be reduced.

(Core Shell Rubber (B1))

The core shell rubber (B1) is a rubber component having a core shell structure in which a center part (a core) and a part surrounding the center (a shell) are made from different polymers.

Examples of a polymer composing the core may include a silicone/acryl polymer, an acrylic polymer, a silicone polymer, a butadiene polymer, and an isoprene polymer. Examples of a polymer composing the shell may include polymethyl methacrylate and polystyrene.

Specific examples of the core shell rubber (B1) may include: product names "S2100", "SX-005", "S-2001", "S-2006", "S-2030", "S-2200", "SRK200A", and "SX-006" manufacture by MITSUBISHI RAYON CO., LTD.; product names "AC3816", "AC3816N", "AC3832", "AC4030", "AC3364", "IM101" manufactured by Aica Kogyo Co., Ltd.; and product names "MX-217", "MX-153", and "MX-960" manufactured by KANEKA CORPORATION.

(Polymer Component (B2))

A weight average molecular weight of the polymer component (B2) is 100000 or more and preferably 850000 or less in terms of improving formability. When the weight average molecular weight of the polymer component (B2) is less than 100000, stress in the semiconductor chip and the printed wiring board cannot be sufficiently reduced and warpage of the semiconductor package due to temperature change might increase.

As the polymer component (B2), elastomers such as an acryl resin and a silicone resin may be used. One kind of such compound may be used alone and two or more kinds of such compounds may be used in combination. The acryl resin is preferably used as the polymer component (B2). When the rubber component (B) contains the acryl resin, elasticity of the cured produce of the prepreg can be reduced and warpage of the semiconductor package due to temperature change can be more reduced.

The acryl resin (B2a) having at least one structure selected from a group consisting of structures represented by the following formula (1), (2), and (3) is preferably used as the acryl resin.

[Chemical formula 1]

(1)

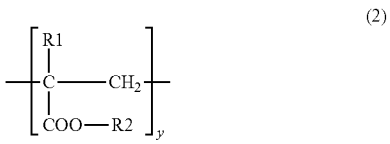

(2)

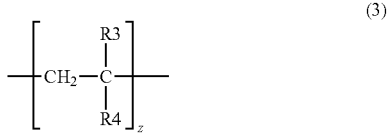

(3)

x represents an integer larger than or equal to 0. y represents an integer larger than or equal to 0. z represents an integer larger than or equal to 0. Note that a case where all of x, y, and z are 0 is excluded. In the formula (2), R1 represents a hydrogen atom or a methyl group, and R2 represents a hydrogen atom or an alkyl group. In the formula (3), R3 represents a hydrogen atom or a methyl group, and R4 represents at least one group selected from a group consisting of -Ph (a phenyl group), —COOCH$_2$Ph, and —COO(CH$_2$)$_2$Ph.

In other words, a main chain of the acryl resin (B2a) preferably has structures represented by at least formula (2) and (3) among the above formula (1), (2), and (3). Also, the acryl resin (B2a) may contain an epoxy group within its molecule.

When the main chain of the acryl resin (B2a) has structures represented by all of the formula (1), (2), and (3), a sequential order of each structure represented by the formula (1), (2), and (3) is not especially limited. In the main chain of the acryl resin (B2a), two or more structures represented by the formula (1) may be continuous or discontinuous, two or more structures represented by the formula (2) may be continuous or discontinuous, and two or more structures represented by the formula (3) may be continuous or discontinuous.

When the main chain of the acryl resin (B2a) has structures represented by the formula (2) and (3), a sequential order of each structure represented by the formula (2) and (3) is not especially limited. In the main chain of the acryl resin (B2a), two or more structures represented by the formula (2) may be continuous or discontinuous, and two or more structures represented by the formula (3) may be continuous or discontinuous.

The structure represented by the formula (3) may have Ph (a phenyl group), —COOCH$_2$Ph, and —COO(CH$_2$)$_2$Ph. The acryl resin (B2a) preferably does not contain an unsaturated bond such as a double bond and a triple bond between carbon atoms. In other words, carbon atoms in the acryl resin (B2a) are preferably bonded by saturated bonds (single bond). A weight average molecular weight (Mw) of the acryl resin (B2a) is preferably 200000 to 850000.

(Inorganic Filler (C))

The resin composition may further contain the inorganic filler (C). When the resin composition contains the inorganic filler (C), thermal expansion of the cured product of the prepreg can be reduced.

Examples of the inorganic filler (C) may include silica such as fused silica (SiO$_2$) and crystalline silica (SiO$_2$), boehmite, aluminum hydroxide, magnesium hydroxide, aluminum silicate, magnesium silicate, talc, clay, and mica. One kind of the above listed compound may be used alone and two or more kinds of the above listed compounds may be used in combination.

An average particle size of the inorganic filler (C) is not especially limited, and preferably within a range of 0.5 to 2.0 μm and more preferably within a range of 0.5 to 1.0 μm. When the average particle size of the inorganic filler (C) is within the range of 0.5 to 2.0 μm, formability of the resin composition can be good. The average particle size of the inorganic filler (C) is a median particle size in a particle size distribution measured by a laser diffraction/scattering method.

An amount of the inorganic filler (C) is preferably less than or equal to 150 parts by mass and more preferably less than or equal to 100 parts by mass, with respect to 100 parts by mass of the thermosetting resin (A).

The resin composition does not need to contain the inorganic filler (C). When the resin composition does not contain the inorganic filler (C), warpage of the semiconductor package due to temperature change can be more reduced compared to a case where the resin composition contains the inorganic filler (C). Further, the amount of desmear etching can be more reduced, and thus conduction reliability of the printed writing board improves.

(Curing Agent)

The resin composition may further contain the curing agent. Examples of the curing agent may include dicyandiamide and zinc octoate.

(Curing Accelerator)

The resin composition may further contain the curing accelerator. Examples of the curing accelerator may include an imidazole compound, an amine compound, a thiol compound, and a metal salt of an organic acid such as a metal soap.

(Additive)

The resin composition may further contain the additive. Examples of the additive may include a thermoplastic resin, a flame retardant, a coloring agent, and a coupling agent.

[Preparation Method of Resin Composition]

One example of a preparation method of the resin composition is to mix and stir predetermined amounts of the thermosetting resin (A), the rubber component (B), and if necessary other components in an organic solvent. In a case where the inorganic filler (C) is added to the resin composition, all the components of the resin composition other than the inorganic filler (C) can be added to an organic solvent to obtain a base resin in a varnish form, and then the inorganic filler (C) can be added to the base resin. Examples of the organic solvent may include an ether, acetone, methylethyl ketone (MEK), dimethyl formamide, benzene, and toluene. Examples of the ether may include ethyleneglycol monomethyl ether.

[Base Material Containing Reinforcing Fiber]

The prepreg contains the base material containing the reinforcing fiber. Examples of the reinforcing fiber may include a glass fiber, aromatic polyamide, liquid crystal polyester, poly(paraphenylene benzobisoxazole) (PBO), and a polyphenylene sulfide resin (PPS). The glass fiber is especially preferably used.

Examples of the glass fiber may include an E glass fiber, a D glass fiber, an S glass fiber, a T glass fiber, an NE glass fiber, and a quartz fiber (a Q fiber). It is especially preferable to use at least one kind selected from a group consisting of the E glass fiber, the T glass fiber, the S glass fiber, the NE glass fiber, and the quartz fiber (a Q fiber), as the glass fiber. In this case, the cured product of the prepreg can have an excellent electronic insulation property and an excellent dielectric property.

A surface of the reinforcing fiber may be coated with a coupling agent. Examples of the coupling agent may include γ-glycidoxy propyl trimethoxysilane, γ-aminopropyl triethoxysilane, and N-phenyl-γ-aminopropyl trimethoxysilane.

A substrate of the reinforcing fibers may be in form of: for example, woven fabric in which warp and weft are woven almost orthogonally as in plain weave; and nonwoven fabric. A thickness of the base material containing the reinforcing fiber is preferably within a range of 10 to 100 μm.

[Manufacturing Method of Prepreg]

One example of a manufacturing method of the prepreg is to obtain a resin-impregnated base material by impregnating the resin composition into the base material containing the reinforcing fiber, and then to semi-cure the resin composition by heating and drying the obtained resin-impregnated base material and thereby removing the solvent in the resin composition. Heating and drying is preferably carried out at a temperature within a range of 110 to 150° C.

[Metal-Clad Laminated Board]

A metal-clad laminated board of the present embodiment (hereinafter referred to as metal-clad laminated board) includes: a cured product (hereinafter referred to as a first insulating layer) of a sheet of the prepreg or a stack of two or more sheets of the prepreg; and a metal foil bonded to one or both surfaces of the cured product. In other words, the metal-clad laminated board has a two-layer structure or a three-layer structure. The metal-clad laminated board of the two-layer structure includes the first insulating layer and the metal foil bonded to one surface of the first insulating layer. The metal-clad laminated board of the three-layer structure includes the first insulating layer and the metal foils bonded to both surfaces of the first insulating layer.

Since the first insulating layer is the cured product of the prepreg, a material property of the first insulating layer is same as a material property of the cured product of the prepreg. In other words, a glass transition temperature (Tg) of the first insulating layer is higher than or equal to 150° C. and lower than or equal to 220° C. Due to this, when the metal-clad laminated board of the present embodiment is used as a material for the semiconductor package, warpage of the semiconductor package due to temperature change can be reduced.

A thickness of the metal-clad laminated board is not especially limited and preferably within a range of 20 to 400 μm.

Examples of the metal foil may include a copper foil, a silver foil, an aluminum foil, and a stainless foil. The copper foil is especially preferably used. A thickness of the metal foil is preferably within a range of 1 to 12 μm.

Examples of a manufacturing method of the metal-clad laminated board may include: a method in which multiple prepregs are stacked to obtain a stack, (a) metal foil(s) is further stacked on one or both surfaces of the obtained stack to obtain a stack with the metal foil(s), and then layers of the stack with the metal foil(s) are integrated by heating and pressurization; and a method in which (a) metal foil(s) is stacked on one or both surfaces of one prepreg to obtain a prepreg with the metal foil(s), and then layers of the prepreg with the metal foil(s) are integrated by heating and pressurization. A condition of heating and pressurization is, for example, 140 to 200° C., 0.5 to 5.0 MPa, 40 to 240 minutes.

[Printed Wiring Board]

A printed wiring board of the present embodiment (hereinafter referred to as printed wiring board) includes: a cured product (hereinafter also referred to as a second insulating layer) of a sheet of the prepreg or a stack of two or more sheets of the prepreg; and a conductor wiring provided on one or both surfaces of the cured product. The printed wiring board includes: a printed wiring board with a single-layer structure (hereinafter also referred to as core board); and a printed wiring board with a multi-layer structure. The printed wiring board with the single-layer structure includes that second insulating layer and the conductor wiring provided on one or both surfaces of the second insulating layer. In the printed wiring board with the multi-layer structure, a second insulating layer(s) (hereinafter referred to as interlayer insulating layer) and a conductor wiring in the layers (hereinafter referred to as innerlayer conductor wiring) are alternately stacked on a surface of the core board on which the conductor wiring is provided, and a conductor wiring is provided on an outermost surface. The number of layers of the printed wiring board with the multi-layer structure is not especially limited.

Since the second insulating layer is the cured product of the prepreg, a material property of the second insulating layer is same as a material property of the cured product of the prepreg. In other words, a glass transition temperature (Tg) of the second insulating layer is higher than or equal to 150° C. and lower than or equal to 220° C. Due to this, when the printed wiring board of the present embodiment is used as a material for the semiconductor package, warpage of the semiconductor package due to temperature change can be reduced.

A manufacturing method of the printed wiring board with the single-layer structure is not especially limited. Examples of a manufacturing method of the printed wiring board with the single-layer structure may include a subtractive method and a semi-additive method. In the subtractive method, the conductor wiring is formed by removing a part of the metal foil of the metal-clad laminated board. In the semi-additive method, all the metal foil(s) of the metal-clad laminated board are removed by etching to obtain a cured product of a stack, (a) thin electroless plating layer(s) is formed on one or both surfaces of the cured product of the stack by electroless plating, plating resists are formed on surfaces where circuits are not formed for protection, (an) electrolytic plating layer(s) is thickly formed on surfaces where the circuits are formed, the plating resists are removed, and then the conductor wiring is formed by carrying out etching to remove the electroless plating layer(s) on the surfaces were the circuits are not formed. A manufacturing method of the printed wiring board with the multi-layer structure is not especially limited, and, for example, a buildup process can be employed.

EXAMPLES

Hereinafter, embodiments of the present invention are specifically explained according to examples.

Examples 1 to 56 and Comparative Examples 1 to 8

[Resin Composition]

Following compounds are prepared as ingredients of the resin composition. The thermosetting resin (A), the rubber component (B), the inorganic filler (C) and the curing accelerator are combined at amounts shown in the tables 1 to 7 and diluted with the solvent (methyl ethyl ketone), which were stirred and mixed for homogenation, thereby the resin composition was obtained.

<(A) Component: Thermosetting Resin>
(Epoxy Resin)
 Product name "EPPN-502H" (triphenyl methane epoxy resin, manufactured by Nippon Kayaku Co., Ltd., epoxy equivalent weight: 170 g/eq)
 Product name "NC-3000" (biphenyl aralkyl epoxy resin, manufactured by Nippon Kayaku Co., Ltd., epoxy equivalent weight: 275 g/eq)
 Product name "NC-3500" (biphenyl aralkyl epoxy resin, manufactured by Nippon Kayaku Co., Ltd., epoxy equivalent weight: 209 g/eq)
 Product name "HP-9500" (naphthalene epoxy resin, manufactured by DIC CORPORATION, epoxy equivalent weight: 230 g/eq)
 Product name "HP-4710" (naphthalene epoxy resin, manufactured by DIC CORPORATION, epoxy equivalent weight: 170 g/eq)
 Product name "YX-7400" (epoxy resin, manufactured by Mitsubishi Chemical Corporation, epoxy equivalent weight: 440 g/eq)
Epoxy equivalent weights are values found in catalogs.
(Phenol Resin)
 Product name "TD-2090" (novolak phenol resin, manufactured by DIC CORPORATION, hydroxyl equivalent weight: 105 g/eq)
 Product name "MEH-7600" (tetrakisphenol phenol resin, manufactured by MEIWA PLASTIC INDUSTRIES. LTD., hydroxyl equivalent weight: 100 g/eq)
 Product name "GPH-103" (biphenyl aralkyl phenol resin, manufactured by Nippon Kayaku Co., Ltd., hydroxyl equivalent weight: 230 g/eq)
 Product name "HPC-9500" (naphthalene phenol resin, manufactured by DIC CORPORATION, hydroxyl equivalent weight: 153 g/eq)
 Product name "TD-2093Y" (novolak phenol resin, manufactured by DIC CORPORATION, hydroxyl equivalent weight: 104 g/eq)
 Product name "HPC-9100" (phosphorus-modified phenol resin, manufactured by DIC CORPORATION, hydroxyl equivalent weight: 373 g/eq)
Hydroxyl equivalent weights are values found in catalogs.
(Bismaleimide Resin)
 Product name "MIR-3000" (maleimide, manufactured by Nippon Kayaku Co., Ltd.)
 Product name "BMI-2300" (phenylmethane maleimide, manufactured by Daiwa Kasei Industry Co., Ltd.)

(Cyanate Resin)
  Product name "BADCy" (bisphenol A cyanate resin, manufactured by LONZA Japan.)
<(B) Component: Polymer Component Having a Weight Average Molecular Weight of 100000 or More and/or Core Shell Rubber>
(Polymer Component (B2) Having a Weight Average Molecular Weight of 100000 or More)
  Product name "SG-P3revised197" (acryl resin, manufactured by Nagase ChemteX Corporation.)
  This acryl resin (product name "SG-P3revised197") has an epoxy value of 0.17 ep/kg and an average molecular weight of 700000.
  Product name "SG-P3 Mwl" (acryl resin, manufactured by Nagase ChemteX Corporation.)
  This acryl resin (product name "SG-P3 Mwl") has a repeating unit represented by the above formula (1) and (2) (R1 in the formula 1 representing a hydrogen atom, R2 in the formula (2) is a butyl group or an ethyl group) and an epoxy group, and does not have any unsaturated bonds between carbon atoms. This acryl resin has an epoxy value of 0.21 ep/kg and an average molecular weight of 260000.
  Product name "SG-80H" (Acryl resin, manufactured by Nagase ChemteX Corporation)
  This acryl resin (product name "SG-80H") has an epoxy value of 0.07 ep/kg and an average molecular weight of 350000.
(Core Shell Rubber (B1))
  Product name "SRK200A" (Core-shell type multi-layer-structure rubber, core: silicone/acryl polymer, shell: acrylonitrile/styrene, average particle size: 0.15 µm, manufacture by MITSUBISHI RAYON CO., LTD.)
  Product name "S-2100" (Core-shell type multi-layer-structure rubber, core: silicone/acryl polymer, shell: polymethyl methacrylate, average particle size: 0.70 µm, manufacture by MITSUBISHI RAYON CO., LTD.)
  Product name "SX-005" (Core-shell type multi-layer-structure rubber, core: silicone/acryl polymer, shell: polymethyl methacrylate, average particle size: 0.20 µm, manufacture by MITSUBISHI RAYON CO., LTD.)
  Product name "AC3816" (Core-shell type multi-layer-structure rubber, core: crosslinked acryl polymer, shell: polymethyl methacrylate, average particle size: 0.3 µm, manufacture by Aica Kogyo Co., Ltd.)
  Product name "MX-217" (Core-shell rubber, manufactured by KANEKA CORPORATION.)
<(C) Component: Inorganic Filler>
  Product name "SC-2500SEJ" (fused silica particles, average particle size: 0.5 µm, manufacture by Admatechs Company Limited)
<Curing Accelerator>
  Product name "2E4MZ" (imidazole, manufacture by SHIKOKU CHEMICALS CORPORATION)
  Product name "Zn-OCTOATE" (zinc octoate, manufacture by DIC CORPORATION)
(Prepreg)
  The resin composition was impregnated into a glass cloth (#2118 type manufactured by Nitto Boseki Co., Ltd., WTX2118 T-107-S199, T glass) so that the cured product of the prepreg had a thickness of 100 µm. The resin composition impregnated into the glass cloth was then heated and dried using a non-contact type heating unit until semi-cured. The heating was carried out at a temperature from 150 to 160° C. Accordingly, the solvent in the resin composition was removed, and the prepreg including the glass cloth and the semi-cured product of the resin composition impregnated into the glass cloth was obtained. A resin content (an amount of resin) of the prepreg was 41 parts by mass with respect to 100 parts by mass.
(Metal-Clad Laminated Board)
  A stack of two sheets of the prepreg was prepared, and copper foils (thickness: 12 µm) are stacked on both surfaces of the stack as the metal foils. An obtained stack with the copper foils went through heating and pressurization to obtain a both-side metal-clad laminated board with a thickness of 0.2 mm. The conditions for heating and pressurization were 210° C., 4 MPa, and 120 minutes.
[Measurements of Material Properties and Evaluations of Warpage Properties]
  The above glass cloth is woven cloth in which warp and weft are woven almost orthogonally. The copper foils bonded to the both surfaces of the both-side metal-clad laminated board were removed, and a cured product of the stack was obtained. The cured product of the stack was cut in a direction at 45° toward the warp or the weft of the glass cloth (bias direction), and thereby samples with the size of 50 mm×5 mm were obtained. Tg (DMA, tension) and elastic modulus (260° C., DMA, tension, bias) were measured for the obtained samples in the following methods. Further, evaluations of desmear resistance and a swing amount (30 to 260° C.) were carried out. Results of the measurements of the material properties and the evaluations of the desmear resistance and the swing amount are shown in the following Tables 1 to 7.
<Tg (Dma, Tension)>
  Using a dynamic mechanical analysis device ("DMS6100" manufactured by SII Nano Technology Inc.), tan δ under a heating condition of 5° C./min (DMA method) was measured, and the peak temperature was defined as the glass transition temperature (Tg).
<Elastic Modulus (260° C., DMA, Tension, Bias)>
  The elastic modulus (dynamic elastic storage modulus) of the sample was measured under an atmosphere at 260° C. by the DMA measurement.
<Desmear Resistance>
  An amount of desmear etching was calculated by subtracting a weight of a sample piece prepared by the following method after desmear process using permanganate from a weight of the sample piece before the desmear process.
  Specifically, the sample piece was obtained by removing the copper foils bonded to the both-side metal-clad laminated board with a size of 10 cm×10 cm. The amount of desmear etching was calculated (in a unit of mg/cm$^2$) by subtracting the weight of the sample piece after desmear process under the following condition from the weight of the sample piece before the desmear process (the initial weight).
  The initial weight of the sample piece before the desmear process was measured after drying the sample piece at 100° C. for 1 hour and then 150° C. for 1 hour followed by air cooling in a desiccator for one day.
  The weight of the sample piece after the desmear process was measured in the following method. First, the sample piece after its initial weight being measured was swelled for 5 minutes using "MLB211" and "CupZ" manufactured by Rohm and Haas and then micro-etched for 6 minutes using "MLB213A-1" and "MLB213B-1" manufactured by Rohm and Haas. After that, the sample piece was neutralized for 5 minutes with "MLB216-2" manufactured by Rohm and Haas, dried for 30 minutes at 130° C., and air-cooled for 1 day in a desiccator. Then, the weight was measured.

It was evaluated that the amount of desmear etching equal to or less than 1.0 mg/cm² shows excellent desmear resistance.

<Swing Amount (30 to 260° C.)>

Parts of the copper foils bonded to the both-side metal-clad laminated board was etched by the subtractive method to form a conductor wiring, and thereby a printed wiring board was obtained. The semiconductor chip (size: 10 mm×10 mm×thickness 0.10 mmt) is mounted on the printed wiring board by flip chip mounting, and reflow process (260° C.) was carried out. After that, space between the semiconductor chip and the printed wiring board was filled with underfill ("CV5300" manufactured by Panasonic Corporation) so that the semiconductor chip was bonded firmly to the printed wiring board, and thereby a semiconductor package (12.5 mm×12.5 mm×thickness 0.27 mmt) was obtained.

Then, the semiconductor package was placed in a warpage measuring device ("THERMOIRE PS200" manufacture by AKROMETRIX) so that the surface of the semiconductor package on which the semiconductor chip was mounted faces downward, and warpage of the semiconductor package at 30 to 260° C. was measured by a 3-dimension shape measurement based on the Shadow Moiré principle. In Table 1, a positive value of the swing amount means that the semiconductor package warps such that the semiconductor package is protruded upward (positive warpage shape). A negative value of the swing amount means that the semiconductor package warps such that the semiconductor package is protruded downward (negative warpage shape).

Based on the above warpage measurements, the swing amount of the semiconductor package is a positive or a negative difference. Specifically, a difference between a maximum value and a minimum value of warpage while the semiconductor package is heated from 30° C. to 260° C. and then cooled to 30° C. is calculated as the swing amount of the semiconductor package. The smaller the swing amount is, the lower the warpage property of the semiconductor package is.

When the swing amount (30 to 260° C.) is lower than or equal to 100 μm, it is evaluated that warpage of the semiconductor package due to temperature change is reduced.

TABLE 1

| Detail | | Product name | Unit | Example 1 | Example 2 | Example 3 | Example 4 | Example 5 | Example 6 | Example 7 | Example 8 | Example 9 | Example 10 |
|---|---|---|---|---|---|---|---|---|---|---|---|---|---|
| (A) component: thermosetting resin | | EPPN-502H | Parts by mass | | | | | | | | | | |
| | | NC-3000 | | 51 | 51 | 51 | 51 | 51 | 33 | 33 | 33 | 33 | 33 |
| | | NC-3500 | | | | | | | 33 | 33 | 33 | 33 | 33 |
| | | HP-9500 | | | | | | | | | | | |
| | | HP-4710 | | | | | | | | | | | |
| | | YX7400 | | | | | | | | | | | |
| | | TD-2090 | Parts by mass | 31 | 31 | 31 | 31 | 31 | | | | | |
| | | MEH-7600 | | | | | | | 34 | 34 | 34 | 34 | 34 |
| | | GPH-103 | | | | | | | | | | | |
| | | HPC-9500 | | | | | | | | | | | |
| | | TD-2093Y | | 4 | 4 | 4 | 4 | 4 | | | | | |
| | | HPC-9100 | | 14 | 14 | 14 | 14 | 14 | | | | | |
| | | MIR-3000 | Parts by mass | | | | | | | | | | |
| | | BMI-2300 | | | | | | | | | | | |
| | | BADCy | Parts by mass | | | | | | | | | | |
| | Total of (A) component (parts by mass) | | Parts by mass | 100 | 100 | 100 | 100 | 100 | 100 | 100 | 100 | 100 | 100 |
| (B) component: polymer component and/or core shell rubber | | SG-P3 revised197 | Acryl resin | 50 | 50 | 50 | 50 | 50 | | 50 | | 50 | 50 |
| | | SG-P3 Mw1 | | | | | | | | | | | |
| | | SG-80H | | | | | | | | | | | |
| | | SRK200A | Core shell rubber | 30 | 50 | 30 | 50 | | 30 | 50 | 30 | 50 | |
| | | S-2100 | | | | | | | | | | | |
| | | SX-005 | | | | | | | | | | | |
| | | AC3816 | | | | | | | | | | | |
| | | MX-217 | | | | | | | | | | | |
| | (B) component with respect to 100 parts by mass of total of (A) component (parts by mass) | | | 30 | 100 | 30 | 100 | 50 | 30 | 100 | 30 | 100 | 50 |
| (C) component: inorganic filler | | SC-2500SEJ | Spherical silica | 0 | 0 | 150 | 150 | 0 | 0 | 0 | 150 | 150 | 0 |
| | (C) component with respect to 100 parts by mass of total of (A) component (parts by mass) | | Parts by mass | 0 | 0 | 150 | 150 | 0 | 0 | 0 | 150 | 150 | 0 |
| Curing accelerator | | 2E4MZ | Parts by mass | 0.1 | 0.1 | 0.1 | 0.1 | 0.1 | 0.1 | 0.1 | 0.1 | 0.1 | 0.1 |
| | | Zinc octoate | Parts by mass | | | | | | | | | | |
| Measurement result | | Tg (DMA · tension) | Fair range (150-220° C.) ° C. | 155 | 153 | 151 | 150 | 154 | 220 | 219 | 217 | 219 | 220 |
| | | Elastic modulus at 250° C. (DMA · tension · bias) | Fair range (0.5-7.0 GPa) GPa | 3.6 | 3.3 | 3.7 | 3.5 | 3.4 | 6.4 | 6.2 | 6.5 | 6.3 | 6.0 |

TABLE 1-continued

| Detail | | Product name | Unit | Example 1 | Example 2 | Example 3 | Example 4 | Example 5 | Example 6 | Example 7 | Example 8 | Example 9 | Example 10 |
|---|---|---|---|---|---|---|---|---|---|---|---|---|---|
| Evaluation result | Desmear resistance | Fair range (≤1.0 mg/cm$^2$) | mg/cm$^2$ | 0.31 | 0.32 | 0.41 | 0.40 | 0.29 | 0.21 | 0.22 | 0.31 | 0.33 | 0.21 |
| | Swing amount (30-260° C.) | Fair range (≤100 μm) | μm | 76 | 71 | 84 | 79 | 73 | 86 | 81 | 93 | 88 | 84 |

TABLE 2

| Detail | | Product name | Unit | Example 11 | Example 12 | Example 13 | Example 14 | Example 15 | Example 16 | Example 17 | Example 18 | Example 19 | Example 20 |
|---|---|---|---|---|---|---|---|---|---|---|---|---|---|
| (A) component: thermosetting resin | Epoxy resin | EPPN-502H | Parts by mass | | | | | | | | | | |
| | | NC-3000 | | 73 | 73 | 73 | 73 | 73 | 61 | 61 | 61 | 61 | 61 |
| | | NC-3500 | | | | | | | 11 | 11 | 11 | 11 | 11 |
| | | HP-9500 | | | | | | | | | | | |
| | | HP-4710 | | | | | | | | | | | |
| | | YX7400 | | | | | | | | | | | |
| | Phenol resin | TD-2090 | Parts by mass | 27 | 27 | 27 | 27 | 27 | 28 | 28 | 28 | 28 | 28 |
| | | MEH-7600 | | | | | | | | | | | |
| | | GPH-103 | | | | | | | | | | | |
| | | HPC-9500 | | | | | | | | | | | |
| | | TD-2093Y | | | | | | | | | | | |
| | | HPC-9100 | | | | | | | | | | | |
| | Bismaleimide resin | MIR-3000 | Parts by mass | | | | | | | | | | |
| | | BMI-2300 | | | | | | | | | | | |
| | Cyanate resin | BADCy | Parts by mass | | | | | | | | | | |
| | Total of (A) component (parts by mass) | | Parts by mass | 100 | 100 | 100 | 100 | 100 | 100 | 100 | 100 | 100 | 100 |
| (B) component: polymer component and/or core shell rubber | Acryl resin | SG-P3 revised197 | | 22 | 45 | 22 | 45 | 50 | 30 | 37 | 30 | 37 | 50 |
| | | SG-P3 Mw1 | | | | | | | | | | | |
| | | SG-80H | | | | | | | | | | | |
| | Core shell rubber | SRK200A | | 23 | 45 | 23 | 45 | | 30 | 38 | 30 | 38 | |
| | | S-2100 | | | | | | | | | | | |
| | | SX-005 | | | | | | | | | | | |
| | | AC3816 | | | | | | | | | | | |
| | | MX-217 | | | | | | | | | | | |
| (B) component with respect to 100 parts by mass of total of (A) component (parts by mass) | | | | 45 | 90 | 45 | 90 | 50 | 60 | 75 | 60 | 75 | 50 |
| (C) component: inorganic filler | Spherical silica | SC-2500SEJ | Parts by mass | 30 | 30 | 120 | 120 | 0 | 60 | 60 | 90 | 90 | 0 |
| (C) component with respect to 100 parts by mass of total of (A) component (parts by mass) | | | | 30 | 30 | 120 | 120 | 0 | 60 | 60 | 90 | 90 | 0 |
| Curing accelerator | | 2E4MZ | Parts by mass | 0.1 | 0.1 | 0.1 | 0.1 | 0.1 | 0.1 | 0.1 | 0.1 | 0.1 | 0.1 |
| | | Zinc octoate | Parts by mass | | | | | | | | | | |
| Measurement result | | Tg (DMA · tension) Fair range (150-220° C.) | ° C. | 169 | 167 | 165 | 164 | 168 | 183 | 181 | 177 | 179 | 180 |
| | | Elastic modulus at 260° C. (DMA · tension · bias) Fair range (0.5-7.0 GPa) | GPa | 4.2 | 4.1 | 4.4 | 4.3 | 4.2 | 4.9 | 4.5 | 5.0 | 4.7 | 4.6 |

TABLE 2-continued

| Detail | | Product name | Unit | Example 11 | Example 12 | Example 13 | Example 14 | Example 15 | Example 16 | Example 17 | Example 18 | Example 19 | Example 20 |
|---|---|---|---|---|---|---|---|---|---|---|---|---|---|
| Evaluation result | Desmear resistance | Fair range (≤1.0 mg/cm²) | mg/cm² | 0.32 | 0.31 | 0.38 | 0.39 | 0.32 | 0.33 | 0.33 | 0.35 | 0.36 | 0.29 |
| | Swing amount (30-260° C.) | Fair range (≤100 μm) | μm | 78 | 73 | 86 | 81 | 75 | 80 | 75 | 88 | 83 | 77 |

TABLE 3

| Detail | | Product name | Unit | Example 21 | Example 22 | Example 23 | Example 24 | Example 25 | Example 26 | Example 27 | Example 28 | Example 29 | Example 30 |
|---|---|---|---|---|---|---|---|---|---|---|---|---|---|
| (A) component: thermosetting resin | Epoxy resin | EPPN-502H | Parts by mass | 43 | 43 | 43 | 43 | 43 | | | | | |
| | | NC-3000 | | | | | | | 34 | 34 | 34 | 34 | 34 |
| | | NC-3500 | | | | | | | 34 | 34 | 34 | 34 | 34 |
| | | HP-9500 | | | | | | | | | | | |
| | | HP-4710 | | | | | | | | | | | |
| | | YX7400 | | | | | | | | | | | |
| | Phenol resin | TD-2090 | Parts by mass | 57 | | | | | | | | | |
| | | MEH-7600 | | | | | | | | | | | |
| | | GPH-103 | | | 57 | 57 | 57 | | | | | | |
| | | HPC-9500 | | | | | | | 32 | 32 | 32 | 32 | 32 |
| | | TD-2093Y | | | | | | | | | | | |
| | | HPC-9100 | | | | | | | | | | | |
| | Bismaleimide resin | MIR-3000 | Parts by mass | | | | | | | | | | |
| | | BMI-2300 | | | | | | | | | | | |
| | Cyanate resin | BADCy | Parts by mass | | | | | 57 | | | | | |
| Total of (A) component (parts by mass) | | | | 100 | 100 | 100 | 100 | 100 | 100 | 100 | 100 | 100 | 100 |
| (B) component: polymer component and/or core shell rubber | Acryl resin | SG-P3 revised197 | Parts by mass | 30 | 37 | 30 | 37 | 50 | 22 | 45 | 22 | 45 | 50 |
| | | SG-P3 Mw1 | | | | | | | | | | | |
| | | SG-80H | | | | | | | | | | | |
| | Core shell rubber | SRK200A | | 30 | 38 | 30 | 38 | | 23 | 45 | 23 | 45 | |
| | | S-2100 | | | | | | | | | | | |
| | | SX-005 | | | | | | | | | | | |
| | | AC3816 | | | | | | | | | | | |
| | | MX-217 | | | | | | | | | | | |
| (B) component with respect to 100 parts by mass of total of (A) component (parts by mass) | | | | 60 | 75 | 60 | 75 | 50 | 45 | 50 | 45 | 90 | 50 |
| (C) component: inorganic filler | Spherical silica | SC-2500SEJ | Parts by mass | 80 | 80 | 90 | 90 | 0 | 30 | 30 | 120 | 120 | 0 |
| (C) component with respect to 100 parts by mass of total of (A) component (parts by mass) | | | | 60 | 60 | 90 | 90 | 0 | 30 | 30 | 120 | 120 | 0 |
| Curing accelerator | | 2E4MZ | Parts by mass | 0.1 | 0.1 | 0.1 | 0.1 | 0.1 | 0.1 | 0.1 | 0.1 | 0.1 | 0.1 |
| | | Zinc octoate | Parts by mass | | | | | | | | | | |
| Measurement result | | Tg (DMA · tension) Fair range (150-220° C.) | ° C. | 200 | 198 | 198 | 195 | 195 | 213 | 211 | 207 | 219 | 210 |
| | | Elastic modulus at 260° C. (DMA · tension · bias) Fair range (0.5-7.0 GPa) | GPa | 5.4 | 5.1 | 5.2 | 5.2 | 5.0 | 6.2 | 6.1 | 6.4 | 6.3 | 6.1 |

TABLE 3-continued

| Detail | | Product name | Unit | Example 21 | Example 22 | Example 23 | Example 24 | Example 25 | Example 26 | Example 27 | Example 28 | Example 29 | Example 30 |
|---|---|---|---|---|---|---|---|---|---|---|---|---|---|
| Evaluation result | Desmear resistance | Fair range (≤1.0 mg/cm$^2$) | mg/cm$^2$ | 0.33 | 0.33 | 0.35 | 0.36 | 0.29 | 0.32 | 0.31 | 0.38 | 0.39 | 0.32 |
| | Swing amount (30-260° C.) | Fair range (≤100 μm) | μm | 82 | 77 | 90 | 85 | 79 | 84 | 79 | 91 | 86 | 82 |

TABLE 4

| Detail | | Product name | Unit | Example 31 | Example 32 | Example 33 | Example 34 | Example 35 | Example 36 | Example 37 | Example 38 | Example 39 | Example 40 |
|---|---|---|---|---|---|---|---|---|---|---|---|---|---|
| (A) component: thermosetting resin | Epoxy resin | EPPN-502H | Parts by mass | 60 | | | | | | | | | |
| | | NC-3000 | | | 60 | | | | | | | | |
| | | NC-3500 | | | | 40 | | | | | | | |
| | | HP-9500 | | | | | 40 | | | | | | |
| | | HP-4710 | | | | | | 28 | 28 | 44 | 44 | | |
| | | YX7400 | | | | | | | | | | 70 | 70 |
| | Phenol resin | TD-2090 | Parts by mass | | | | | | | | | | |
| | | MEH-7600 | | | | | | | | | | | |
| | | GPH-103 | | | | | | | | | | | |
| | | HPC-9500 | | | | | | 12 | 12 | 16 | 16 | | |
| | | TD-2093Y | | | | | | | | | | | |
| | | HPC-9100 | | | | | | | | | | | |
| | Bismaleimide resin | MIR-3000 | Parts by mass | 40 | | | | | | | | | |
| | | BMI-2300 | | | 40 | 60 | 60 | 60 | 60 | 40 | 40 | | |
| | Cyanate resin | BADCy | Parts by mass | | | | | | | | | 30 | 30 |
| | Total of (A) component (parts by mass) | | | 100 | 100 | 100 | 100 | 100 | 100 | 100 | 100 | 100 | 100 |
| (B) component: polymer component and/or core shell rubber | Acryl resin | SG-P3 revised197 | Parts by mass | 30 | 30 | 50 | 22 | | 50 | 30 | 37 | 50 | 50 |
| | | SG-P3 Mw1 | | | | | | | | | | | |
| | | SG-80H | | | | | | | | | | | |
| | Core shell rubber | SRK200A | | 30 | 30 | | 23 | 30 | 50 | 30 | 38 | 50 | |
| | | S-2100 | | | | | | | | | | | |
| | | SX-005 | | | | | | | | | | | |
| | | AC3816 | | | | | | | | | | | |
| | | MX-217 | | | | | | | | | | | |
| | (B) component with respect to 100 parts by mass of total of (A) component (parts by mass) | | | 60 | 60 | 50 | 45 | 30 | 100 | 60 | 75 | 100 | 50 |
| (C) component: inorganic filler | Spherical silica | SC-2500SEJ | Parts by mass | 60 | 90 | 0 | 30 | 0 | 150 | 90 | 60 | 150 | 0 |
| | (C) component with respect to 100 parts by mass of total of (A) component (parts by mass) | | | 60 | 90 | 0 | 30 | 0 | 150 | 90 | 60 | 150 | 0 |
| Curing accelerator | | 2E4MZ | Parts by mass | 0.1 | 0.1 | 0.1 | 0.1 | 0.1 | 0.1 | 0.1 | 0.1 | | |
| | | Zinc octoate | Parts by mass | | | | | | | | | 0.1 | 0.1 |
| Measurement result | | Tg (DMA · tension) Fair range (150-220° C.) | ° C. | 183 | 177 | 210 | 213 | 220 | 219 | 177 | 181 | 219 | 220 |
| | | Elastic modulus at 260° C. (DMA · tension · bias) Fair range (0.5-7.0 GPa) | GPa | 4.9 | 5.1 | 6.3 | 6.4 | 6.5 | 6.3 | 5.0 | 4.8 | 6.4 | 6.6 |

TABLE 4-continued

| Detail | | Product name | Unit | Example 31 | Example 32 | Example 33 | Example 34 | Example 35 | Example 36 | Example 37 | Example 38 | Example 39 | Example 40 |
|---|---|---|---|---|---|---|---|---|---|---|---|---|---|
| Evaluation result | Desmear resistance | Fair range (≤1.0 mg/cm$^2$) | mg/cm$^2$ | 0.35 | 0.34 | 0.29 | 0.30 | 0.45 | 0.58 | 0.52 | 0.48 | 0.43 | 0.27 |
| | Swing amount (30-260° C.) | Fair range (≤100 μm) | μm | 80 | 88 | 82 | 84 | 86 | 88 | 88 | 75 | 88 | 84 |

TABLE 5

| Detail | | Product name | Unit | Example 41 | Example 42 | Example 43 | Example 44 | Example 45 | Example 46 | Example 47 | Example 48 | Example 49 | Example 50 |
|---|---|---|---|---|---|---|---|---|---|---|---|---|---|
| (A) component: thermosetting resin | Epoxy resin | EPPN-502H | Parts by mass | | | | | | | | | | |
| | | NC-3000 | | | | | | | | 51 | 33 | 51 | 65 |
| | | NC-3500 | | | | | | | | | 33 | | |
| | | HP-9500 | | 70 | 70 | | | | | | | | |
| | | HP-4710 | | | | | 10 | | | | | | |
| | | YX7400 | | | | 10 | | 30 | 30 | | | | |
| | Phenol resin | TD-2090 | Parts by mass | | | | | | | | | | |
| | | MEH-7600 | | | | | | | | | | | |
| | | GPH-103 | | | | | | | | 31 | 34 | 31 | 35 |
| | | HPC-9500 | | | | | | | | | | | |
| | | TD-2093Y | | | | | | | | 4 | | 4 | |
| | | HPC-9100 | | | | | | | | 14 | | 14 | |
| | Bismaleimide resin | MIR-3000 | Parts by mass | 30 | 30 | 60 | | | 60 | | | | |
| | | BMI-2300 | | | | | | | | | | | |
| | Cyanate resin | BADCy | Parts by mass | | | 30 | | 10 | 10 | | | | |
| | Total of (A) component (parts by mass) | | | 100 | 100 | 100 | 100 | 100 | 100 | 100 | 100 | 100 | 100 |
| (B) component: polymer component and/or core shell rubber | Acryl resin | SG-P3 revised197 | Parts by mass | 37 | 30 | 50 | 30 | 30 | 37 | 50 | 50 | 50 | 48 |
| | | SG-P3 Mw1 | | | | | | | | | | | |
| | | SG-80H | | | | | | | | | | | |
| | Core shell rubber | SRK200A | | 38 | 30 | 50 | 30 | 30 | 38 | | | | |
| | | S-2100 | | | | | | | | 50 | | | |
| | | SX-005 | | | | | | | | | 50 | | |
| | | AC3816 | | | | | | | | | | 50 | |
| | | MX-217 | | | | | | | | | | | 12 |
| (B) component with respect to 100 parts by mass of total of (A) component (parts by mass) | | | | 75 | 60 | 100 | 30 | 60 | 75 | 100 | 100 | 100 | 60 |
| (C) component: inorganic filler | Spherical silica | SC-2500SEJ | Parts by mass | 60 | 90 | 0 | 150 | 60 | 60 | 0 | 0 | 0 | 60 |
| (C) component with respect to 100 parts by mass of total of (A) component (parts by mass) | | | | 60 | 90 | 0 | 150 | 60 | 60 | 0 | 0 | 0 | 60 |
| Curing accelerator | | 2E4MZ | Parts by mass | 0.1 | 0.1 | 0.1 | 0.1 | | 0.1 | 0.1 | 0.1 | 0.1 | 0.1 |
| | | Zinc octoate | Parts by mass | | | | | 0.1 | | | | | |
| Measurement result | | Tg (DMA · tension) Fair range (150–220° C.) | ° C. | 181 | 177 | 219 | 217 | 183 | 181 | 153 | 218 | 153 | 183 |
| | | Elastic modulus at 260° C. (DMA · tension · bias) Fair range (0.5–7.0 GPa) | GPa | 5.0 | 5.1 | 6.1 | 6.5 | 5.0 | 5.1 | 3.8 | 6.2 | 3.5 | 4.7 |

TABLE 5-continued

| Detail | | Product name | Unit | Example 41 | Example 42 | Example 43 | Example 44 | Example 45 | Example 46 | Example 47 | Example 48 | Example 49 | Example 50 |
|---|---|---|---|---|---|---|---|---|---|---|---|---|---|
| Evaluation result | Desmear resistance | Fair range (≤1.0 mg/cm$^2$) | mg/cm$^2$ | 0.44 | 0.47 | 0.30 | 0.41 | 0.44 | 0.43 | 0.34 | 0.24 | 0.22 | 0.45 |
| | Swing amount (30-260° C.) | Fair range (≤100 μm) | μm | 75 | 88 | 81 | 93 | 80 | 75 | 71 | 81 | 71 | 92 |

TABLE 6

| Detail | Product name | | Unit | Example 51 | Example 52 | Example 53 | Example 54 | Example 55 | Example 56 |
|---|---|---|---|---|---|---|---|---|---|
| (A) component: thermosetting resin | EPPN-502H | Epoxy resin | Parts by mass | | 33 | | | 33 | |
| | NC-3000 | | | 51 | 33 | | | 33 | |
| | NC-3500 | | | | | | | | |
| | HP-9500 | | | | | | | | 57 |
| | HP-4710 | | | | | | | | |
| | YX7400 | | | | | | | | |
| | TD-2090 | Phenol resin | Parts by mass | | 34 | | | 34 | |
| | MEH-7600 | | | | | | | | |
| | GPH-103 | | | 31 | | | | | |
| | HPC-9500 | | | | | | | | 25 |
| | TD-2093Y | | | | 4 | | | | 4 |
| | HPC-9100 | | | | 14 | | | | 14 |
| | MIR-3000 | Bismaleimide resin | Parts by mass | | | 70 | 70 | | |
| | BMI-2300 | | | | | | | | |
| | BADCy | Cyanate resin | Parts by mass | | | 30 | 30 | | |
| Total of (A) component (parts by mass) | | | | 100 | 100 | 100 | 100 | 100 | 100 |
| (B) component: polymer component and/or core shell rubber | SG-P3 revised197 | Acryl resin | Parts by mass | | | | | 50 | |
| | SG-P3 Mw1 | | | 50 | | | | | 50 |
| | SG-80H | | | | | 50 | | | |
| | SRK200A | Core shell rubber | | 50 | 50 | 50 | 30 | 50 | 50 |
| | S-2100 | | | | | | | | |
| | SX-005 | | | | | | | | |
| | AC3816 | | | | | | | | |
| | MX-217 | | | | | | | | |
| (B) component with respect to 100 parts by mass of total of (A) component (parts by mass) | | | | 100 | 100 | 50 | 30 | 100 | 100 |
| (C) component: inorganic filler | SC-2500SEJ | Spherical silica | Parts by mass | 150 | 150 | 0 | 150 | 200 | 150 |
| (C) component with respect to 100 parts by mass of total of (A) component (parts by mass) | | | | 150 | 150 | 0 | 150 | 200 | 150 |
| Curing accelerator | 2E4MZ | — | Parts by mass | 0.1 | 0.1 | | | 0.1 | 0.1 |
| | Zinc octoate | — | Parts by mass | | | 0.1 | 0.1 | | |
| Measurement result | Tg (DMA · tension) | Fair range (150-220° C.) | ° C. | 150 | 219 | 219 | 217 | 220 | 220 |
| | Elastic modulus at 260° C. (DMA · tension · bias) | Fair range (0.5-7.0 GPa) | GPa | 3.3 | 6.2 | 6.5 | 6.6 | 7.0 | 6.4 |
| Evaluation result | Desmear resistance | Fair range (≤1.0 mg/cm$^2$) | mg/cm$^2$ | 0.61 | 0.42 | 0.24 | 0.31 | 0.39 | 0.40 |
| | Swing amount | Fair range (≤100 μm) | μm | 79 | 88 | 81 | 93 | 98 | 87 |

TABLE 7

| Detail | | Product name | Unit | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|---|
| (A) component: thermosetting resin | | EPPN-502H | Parts by mass | 38 | 53 | | | | | 40 | 45 |
| | | NC-3000 | | | 10 | | | | | 26 | 20 |
| | | NC-3500 | | | | 34 | | | | | |
| | | HP-9500 | | | | 34 | 28 | | 28 | | |
| | | HP-4710 | | 20 | | | | 10 | | | |
| | | YX7400 | | | | | | | | | |
| | | TD-2090 | Parts by mass | 42 | 37 | 32 | 12 | | 12 | 34 | 35 |
| | | MEH-7600 | | | | | | | | | |
| | | GPH-103 | | | | | | | | | |
| | | HPC-9500 | | | | | | | | | |
| | | TD-2093Y | | | | | | | | | |
| | | HPC-9100 | | | | | | | | | |
| | | MIR-3000 | Bismaleimide resin | Parts by mass | | | | 60 | 60 | 60 | | |
| | | BMI-2300 | | | | | | | | | |
| | | BADCy | Cyanate resin | Parts by mass | | | | | 30 | | | |
| | Total of (A) component (parts by mass) | | Parts by mass | 100 | 100 | 100 | 100 | 100 | 100 | 100 | 100 |
| (B) component: polymer component and/or core shell rubber | | SG-P3 revised197 | Acryl resin | | | 30 | | | | 80 | |
| | | SG-P3 Mw1 | | | | | | | | | |
| | | SG-80H | | | | | | | | | |
| | | SRK200A | Core shell rubber | Parts by mass | 30 | 30 | 5 | 200 | 20 | 120 | 30 | 30 |
| | | S-2100 | | | | | | | | | |
| | | SX-005 | | | | | | | | | |
| | | AC3816 | | | | | | | | | |
| | | MX-217 | | | | | | | | | |
| | (B) component with respect to 100 parts by mass of total of (A) component (parts by mass) | | | 30 | 60 | 5 | 200 | 20 | 200 | 30 | 30 |
| (C) component: inorganic filler | | SC-2500SEJ | Spherical silica | Parts by mass | | 80 | 150 | 150 | 150 | 150 | 150 | 150 |
| | (C) component with respect to 100 parts by mass of total of (A) component (parts by mass) | | | 0 | 80 | 150 | 150 | 150 | 150 | 150 | 150 |
| Curing accelerator | | 2E4MZ | | Parts by mass | 0.1 | 0.1 | | | 0.1 | | 0.1 | 0.1 |
| | | Zinc octoate | | Parts by mass | | | | | | | | |
| Measurement result | | Tg (DMA · tension) | Fair range (150-220° C.) | ° C. | 135 | 250 | 220 | Measurement was impossible (Varnish was highly viscous) | 217 | Measurement was impossible (Varnish was highly viscous) | 230 | 240 |
| | | Elastic modulus at 260° C. (DMA · tension · bias) | Fair range (0.5-7.0 GPa) | GPa | 2.5 | 7.5 | 5.0 | | 6.5 | | 6.8 | 7.4 |

TABLE 7-continued

| Detail | | Unit | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|
| Evaluation result | Product name | | | | | | | | | |
| Desmear resistance | Fair range (≤1.0 mg/cm²) | mg/cm² | 1.5 | 0.3 | 0.5 | Evaluation was impossible (Varnish was highly viscous) | 0.41 | Evaluation was impossible (Varnish was highly viscous) | 0.31 | 0.31 |
| Swing amount (30-260° C.) | Fair range (≤100 μm) | μm | 75 | 110 | 120 | | 103 | | 101 | 109 |

The invention claimed is:

1. A prepreg comprising:
a base material containing a reinforcing fiber; and
a semi-cured product of a resin composition impregnated into the base material containing a reinforcing fiber, wherein:
the prepreg after cured has a glass transition temperature (Tg) which is higher than or equal to 150° C. and lower than or equal to 220° C.,
the resin composition comprises:
   an (A) component containing a thermosetting resin; and
   a (B) component containing a polymer component having a weight average molecular weight of 350000 or more, the polymer component having a structure represented by the following formula (3):

where z represents an integer larger than 0, R3 represents a hydrogen atom or a methyl group, and R4 represents at least one group selected from the group consisting of -Ph (a phenyl group), —COOCH$_2$Ph, and —COO(CH$_2$)$_2$Ph,
an amount of the (B) component is higher than or equal to 75 parts by mass and lower than or equal to 100 parts by mass with respect to 100 parts by mass of the (A) component,
the (B) component further contains core shell rubber, and
a thickness of the prepreg is in a range from 0.010 mm to 0.200 mm.

2. The prepreg according to claim 1, further comprising a (C) component containing an inorganic filler.

3. The prepreg according to claim 2, wherein
an amount of the (C) component is less than or equal to 150 parts by mass with respect to 100 parts by mass of the (A) component.

4. The prepreg according to claim 1, wherein
the (A) component contains at least one compound selected from the group consisting of epoxy resin, phenol resin, bismaleimide resin, and cyanate resin.

5. The prepreg according to claim 1, wherein
the polymer component contains an acryl resin.

6. The prepreg according to claim 1, wherein
the polymer component further has structures represented by the following formulae (1) and (2):

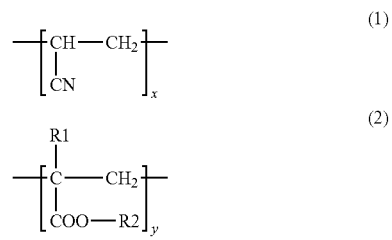

where x represents an integer larger than 0, y represents an integer larger than 0, and
in the formula (2), R1 represents a hydrogen atom or a methyl group, and R2 represents a hydrogen atom or an alkyl group.

7. A metal-clad laminated board comprising:
a cured product of a sheet or a stack of two or more sheets of the prepreg according to claim 1; and
a metal foil bonded to one or both surfaces of the cured product.

8. The metal-clad laminated board according to claim 7, wherein a thickness of the metal-clad laminated board is in a range from 20 μm to 400 μm.

9. A printed wiring board comprising:
a cured product of a sheet or a stack of two or more sheets of the prepreg according to claim 1; and
a conductor wiring provided on one or both surfaces of the cured product.

* * * * *